(12) United States Patent
Hur et al.

(10) Patent No.: US 10,872,937 B2
(45) Date of Patent: Dec. 22, 2020

(54) ORGANIC ELECTROLUMINESCENCE DISPLAY DEVICE

(71) Applicant: Samsung Display Co., Ltd., Yongin-si, Gyeonggi-do (KR)

(72) Inventors: Jaeweon Hur, Busan (KR); Sukhoon Kang, Seoul (KR); Hyein Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/954,331

(22) Filed: Apr. 16, 2018

(65) Prior Publication Data

US 2019/0043936 A1 Feb. 7, 2019

(30) Foreign Application Priority Data

Aug. 7, 2017 (KR) .................. 10-2017-0099827

(51) Int. Cl.
*H01L 27/32* (2006.01)
*H01L 51/00* (2006.01)
*H01L 51/52* (2006.01)

(52) U.S. Cl.
CPC ........ *H01L 27/3246* (2013.01); *H01L 51/004* (2013.01); *H01L 51/0035* (2013.01); *H01L 51/0067* (2013.01); *H01L 51/0094* (2013.01); *H01L 51/5284* (2013.01)

(58) Field of Classification Search
CPC ... H01L 27/32; H01L 27/324; H01L 27/3246; H01L 51/004; H01L 51/0035; H01L 51/0067; H01L 51/0094

USPC .......................................................... 257/40
See application file for complete search history.

(56) References Cited

U.S. PATENT DOCUMENTS

| 5,015,678 | A | * | 5/1991 | Seltzer | C07D 211/94 |
| | | | | | 524/99 |
| 6,166,148 | A | * | 12/2000 | Ohrbom | C09D 7/48 |
| | | | | | 525/326.7 |
| 6,958,176 | B2 | * | 10/2005 | Li | C07D 211/46 |
| | | | | | 252/299.01 |
| 9,274,419 | B2 | * | 3/2016 | Hsu | G03F 7/0007 |
| 9,673,418 | B2 | | 6/2017 | Lim et al. | |
| 2001/0018520 | A1 | * | 8/2001 | Galbo | C07D 211/94 |
| | | | | | 546/186 |
| 2002/0028937 | A1 | * | 3/2002 | Gupta | C07D 251/24 |
| | | | | | 544/215 |

(Continued)

FOREIGN PATENT DOCUMENTS

| KR | 10-0863043 B1 | 10/2008 |
| KR | 10-2016-0093236 A | 8/2016 |
| KR | 10-2016-0113447 A | 9/2016 |

*Primary Examiner* — Fazli Erdem
(74) *Attorney, Agent, or Firm* — Lewis Roca Rothgerber Christie LLP

(57) ABSTRACT

Provided is an organic electroluminescence display device including a substrate, a first electrode disposed on the substrate, a pixel defining layer disposed on the first electrode and having an opening defined therein for exposing at least a part of the first electrode, an organic layer disposed on the first electrode exposed by the opening and including a light emitting layer, and a second electrode disposed on the organic layer, wherein the pixel defining layer includes a base resin and a hindered amine light stabilizer (HALS).

10 Claims, 7 Drawing Sheets

(56) References Cited

U.S. PATENT DOCUMENTS

| | | | |
|---|---|---|---|
| 2003/0127627 A1* | 7/2003 | Amakawa | C09K 19/58 252/299.01 |
| 2004/0225041 A1* | 11/2004 | Kataoka | C08K 5/34 524/116 |
| 2007/0103069 A1* | 5/2007 | Manuela | H05B 33/04 313/512 |
| 2007/0108411 A1* | 5/2007 | Saito | C09K 19/3458 252/299.61 |
| 2010/0197186 A1* | 8/2010 | Shin | C08G 59/32 445/24 |
| 2011/0101270 A1* | 5/2011 | Manabe | C09K 19/32 252/299.62 |
| 2011/0230602 A1* | 9/2011 | Nagai | C08L 59/02 524/88 |
| 2013/0048604 A1* | 2/2013 | Kang | G03F 7/0045 216/49 |
| 2013/0145962 A1* | 6/2013 | Gupta | C08K 5/1545 106/287.21 |
| 2013/0285026 A1* | 10/2013 | Miskiewicz | H01L 51/0034 257/40 |
| 2014/0145217 A1* | 5/2014 | Lee | H01L 27/1248 257/88 |
| 2015/0002797 A1* | 1/2015 | Roh | C09K 19/54 349/123 |
| 2015/0207107 A1* | 7/2015 | Schwartz | H01L 51/5281 257/40 |
| 2015/0268554 A1* | 9/2015 | Hsu | G03F 7/0007 430/285.1 |
| 2015/0280128 A1* | 10/2015 | Bain | H01L 51/107 257/40 |
| 2015/0346405 A1* | 12/2015 | Hsu | G02B 5/223 252/586 |
| 2016/0009952 A1* | 1/2016 | Wood | C09D 5/036 522/63 |
| 2016/0126466 A1* | 5/2016 | Jeong | H01L 51/0072 257/40 |
| 2016/0145427 A1* | 5/2016 | Eng | C08K 5/06 524/100 |
| 2016/0177131 A1* | 6/2016 | Woo | C09D 183/06 428/336 |
| 2016/0276417 A1* | 9/2016 | Huang | H01L 27/3246 |
| 2016/0276419 A1* | 9/2016 | Lim | H01L 51/5246 |
| 2017/0003808 A1* | 1/2017 | Kim | G06F 3/044 |
| 2017/0068128 A1* | 3/2017 | Lim | G02F 1/133512 |
| 2018/0155321 A1* | 6/2018 | Kim | G02F 1/1503 |
| 2018/0197927 A1* | 7/2018 | Tan | H01L 51/0005 |
| 2019/0168449 A1* | 6/2019 | Talken | C08F 290/067 |
| 2019/0280064 A1* | 9/2019 | Kim | H01L 51/0085 |

* cited by examiner

ORGANIC ELECTROLUMINESCENCE DISPLAY DEVICE

CROSS-REFERENCE TO RELATED APPLICATION

This application claims priority to and the benefit of Korean Patent Application No. 10-2017-0099827, filed on Aug. 7, 2017, the entire contents of which are incorporated herein by reference.

BACKGROUND

The present disclosure herein relates to an organic electroluminescence display device, and, for example, to an organic electroluminescence display device configured to include an additive for allowing a pixel defining layer to remove or capture radicals.

Various display devices used for multimedia devices such as a television, a mobile phone, a tablet computer, a navigation device, and a game machine have been developed. When using these display devices, external light is provided into a display panel inside a display device to cause damages to the display panel due to heat or light.

Therefore, a research has been required to increase optical reliability of a display panel by blocking ultraviolet rays and some visible rays, both provided from the outside.

SUMMARY

The present disclosure provides an organic electroluminescence display device having improved reliability and display quality by preventing a pixel defining layer from being damaged due to external light (or by reducing a likelihood or amount of such damage).

An embodiment of the present disclosure provides an organic electroluminescence display device including a substrate, a first electrode disposed on the substrate, a pixel defining layer disposed on the first electrode and having an opening defined therein for exposing at least a part of the first electrode, an organic layer disposed on the first electrode exposed by the opening and including a light emitting layer, and a second electrode disposed on the organic layer, wherein the pixel defining layer includes a base resin and a hindered amine light stabilizer (HALS).

In an embodiment, the hindered amine light stabilizer may be included in an amount of 0.01 wt % to 5.0 wt % based on the total 100 wt % of the base resin.

In an embodiment, the hindered amine light stabilizer may include at least one of a first compound having a structure represented by formula 1 below in a molecule and a second compound having a structure represented by formula 2 below in a molecule.

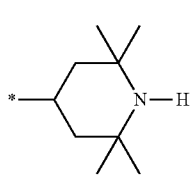

Formula 1

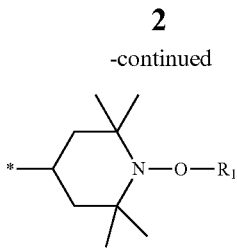

Formula 2

In Formula 2, $R_1$ is a hydrogen atom, a substituted or unsubstituted alkyl group having 1 to 10 carbon atoms, or a substituted or unsubstituted aryl group having 6 to 20 ring-forming carbon atoms.

In an embodiment, Formula 1 may be represented by formula 1-1 below.

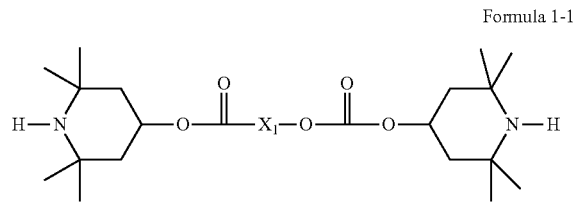

Formula 1-1

In Formula 1-1, $X_1$ is a unit including any one of the following structural formulas or a combination thereof.

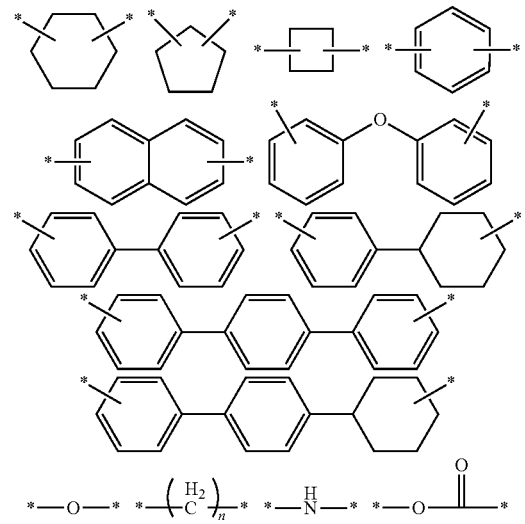

In the structural formula, n is an integer from 1 to 10.

In an embodiment, Formula 2 may be represented by formula 2-1 below.

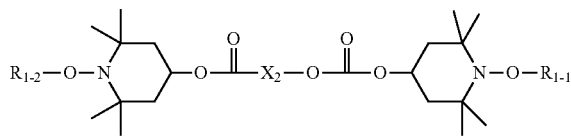

Formula 2-1

In Formula 2-1, $R_{1-1}$ and $R_{1-2}$ are each independently a hydrogen atom, a substituted or unsubstituted alkyl group having 1 to 10 carbon atoms, or a substituted or unsubstituted aryl group having 6 to 20 ring-forming carbon atoms, and $X_2$ is a unit including any one of the following structural formulas or a combination thereof.

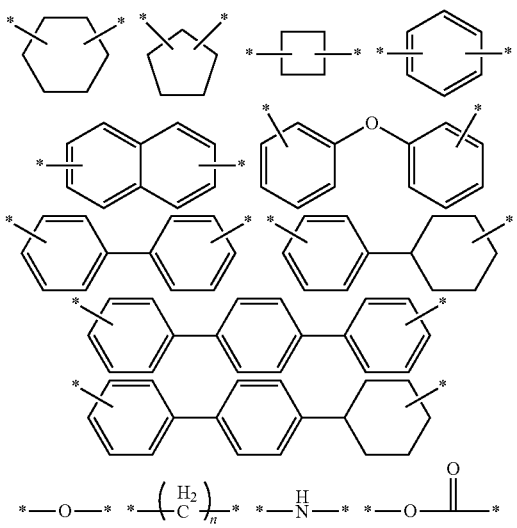

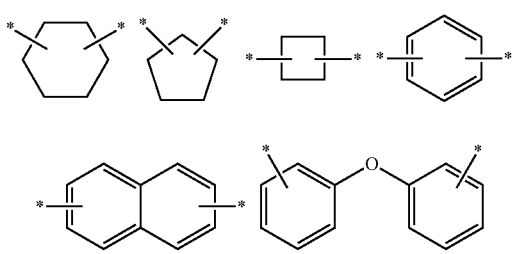

In the structural formula, n is an integer from 1 to 10.

In an embodiment, the hindered amine light stabilizer may include both the first compound and the second compound.

In an embodiment, the base resin may include at least one of a polyimide-based resin, a polyamide-based resin, a polyacrylic resin, or a siloxane-based resin.

In an embodiment, the base resin may include a polyamide-based resin represented by formula 3 below.

Formula 3

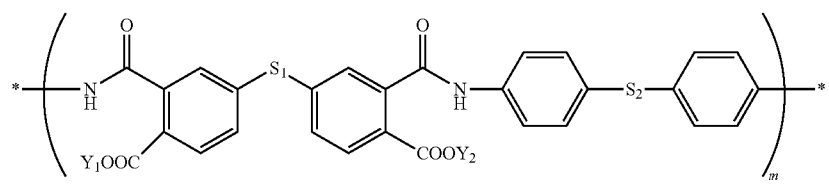

In Formula 3, m is an integer from 1 to 1000, $Y_1$ and $Y_2$ are each independently a hydrogen atom, a substituted or unsubstituted alkyl group having 1 to 10 carbon atoms, or a substituted or unsubstituted aryl group having 6 to 20 ring-forming carbon atoms, and $S_1$ and $S_2$ are each independently a unit including any one of the following structural formulas or a combination thereof.

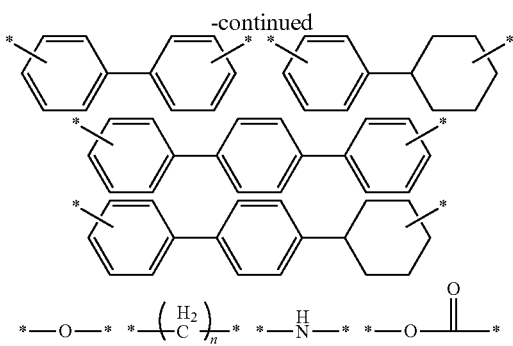

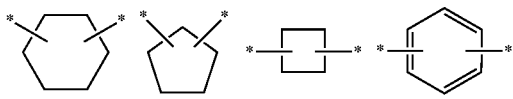

In the structural formula, n is an integer from 1 to 10.

In an embodiment, the base resin may include a siloxane-based resin represented by formula 4 below.

Formula 4

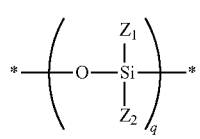

In Formula 4, q is an integer from 1 to 1000, $Z_1$ and $Z_2$ are each independently a unit including any one of the following structural formulas or a combination thereof.

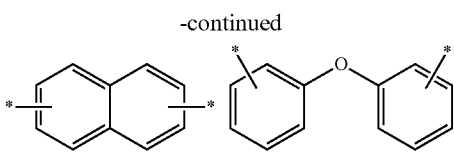

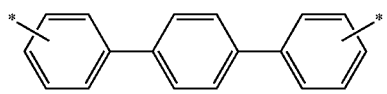

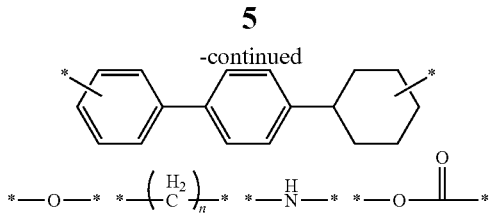

In the structural formula, n is an integer from 1 to 10.

In an embodiment, the pixel defining layer further includes an ultraviolet ray absorbing agent.

BRIEF DESCRIPTION OF THE FIGURES

The accompanying drawings are included to provide a further understanding of the subject matter of the present disclosure, and are incorporated in and constitute a part of this disclosure. The drawings illustrate exemplary embodiments of the present disclosure and, together with the description, serve to explain principles of the present disclosure. In the drawings.

DETAILED DESCRIPTION

Figure 1:
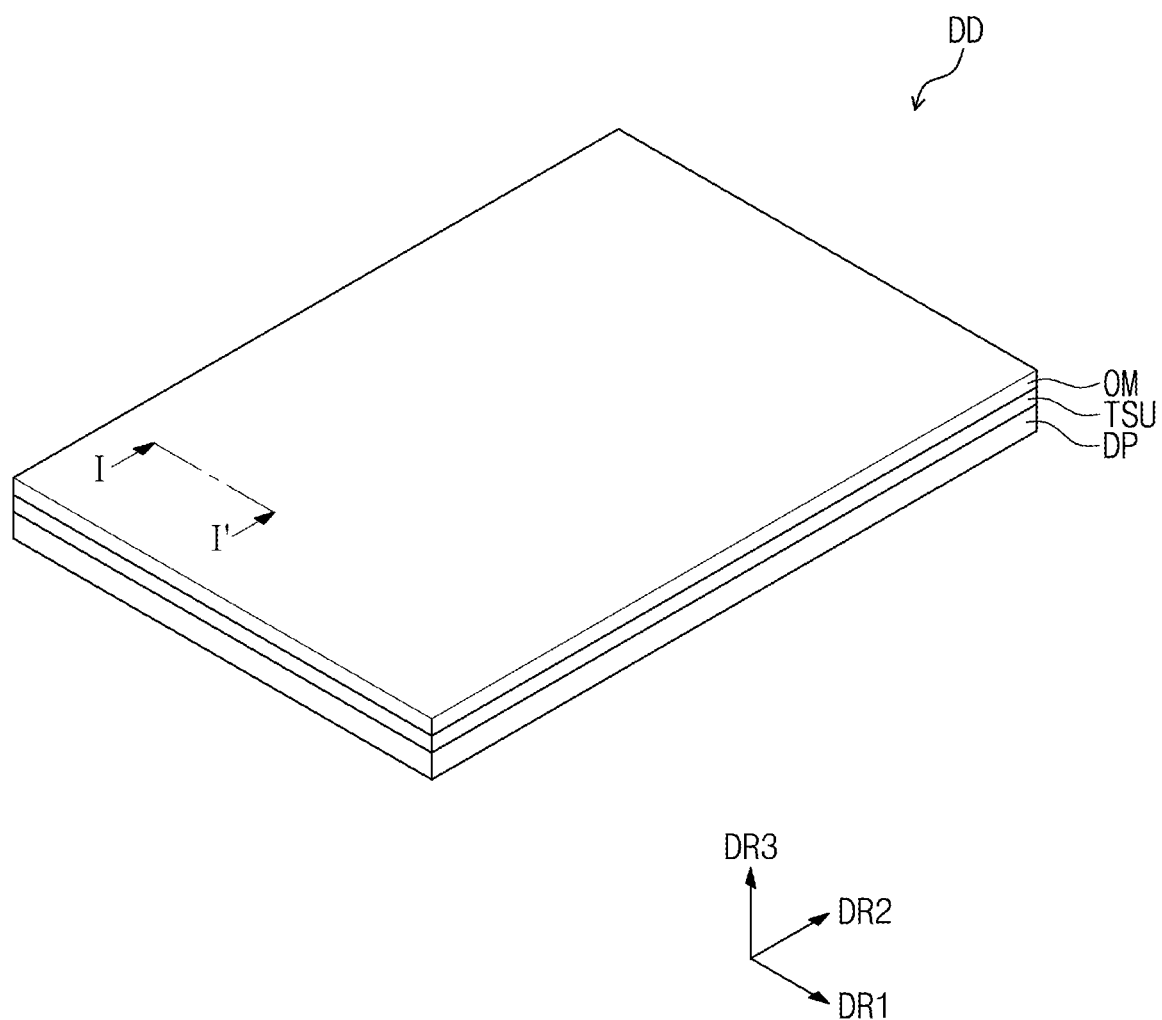
FIG. 1 is a perspective view of an organic electroluminescence display device according to an embodiment of the present disclosure.

Objects, other objects, features, and advantages of the present disclosure described above may be understood easily by reference to the exemplary embodiments and the accompanying drawings. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In describing each drawing, similar reference numerals were used for similar elements. Also, in the accompanying drawings, the dimensions of structures may be exaggerated for clarity of the subject matter of the present disclosure. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In this disclosure, terms "comprise" or "have" are intended to designate features, numbers, steps, operations, elements, parts, or combinations thereof described in the specification of the present disclosure but not to exclude the possibility of the presence or the addition of one or more other features, numbers, steps, operations, elements, parts, or combinations thereof. It will also be understood that when a portion, such as a layer, a film, a region, and a plate is referred to as being "on" another portion, it can be "directly on" the other portion, or one or more intervening portions may also be present. On the other hand, it will be understood that when a portion, such as a layer, a film, a region, and a plate is referred to as being "under" another portion, it can be "directly under", or one or more intervening portions may also be present.

Hereinafter, an organic electroluminescence display device according to an embodiment of the present disclosure will be described with reference to the accompanying drawings.

FIG. 1 is a perspective view of an organic electroluminescence display device according to an embodiment of the present disclosure. Referring to FIG. 1, an organic electroluminescence display device DD according to an embodiment of the present disclosure may include an organic electroluminescence display panel DP, an input sensing unit TSU disposed on the organic electroluminescence display panel DP, and an optical member OM disposed on the organic electroluminescence display panel DP. The optical member OM may be disposed on the input sensing unit TSU, but the present embodiment is not limited thereto.

The optical member OM may block external light provided to the organic electroluminescence display panel DP from the outside. The optical member OM may be a polarizing member blocking external light, or a color filter member having a color filter layer.

The input sensing unit TSU may recognize a direct touch of a user, an indirect touch of a user, a direct touch of an object, or an indirect touch of an object. The input sensing unit TSU may recognize at least one of the position of a touch and the strength (pressure) of a touch externally applied. The input sensing unit TSU according to an embodiment of the present disclosure may have various structures, or be formed of various materials, but is not limited to any one embodiment. For example, the input sensing unit TSU in the display device DD of an embodiment may be a touch sensing unit configured to sense a touch.

Meanwhile, in the perspective view of FIG. 1, the organic electroluminescence display device DD is illustrated to include both the input sensing unit TSU and the optical member OM, but is not limited thereto. In the organic electroluminescence display device DD according to an embodiment of the present disclosure, the input sensing unit TSU may be omitted. Also, in the organic electroluminescence display device DD according to an embodiment of the present disclosure, the optical member OM may be omitted. Also, in the organic electroluminescence display device DD according to an embodiment of the present disclosure, both the input sensing unit TSU and the optical member OM may be omitted.

Figure 2:
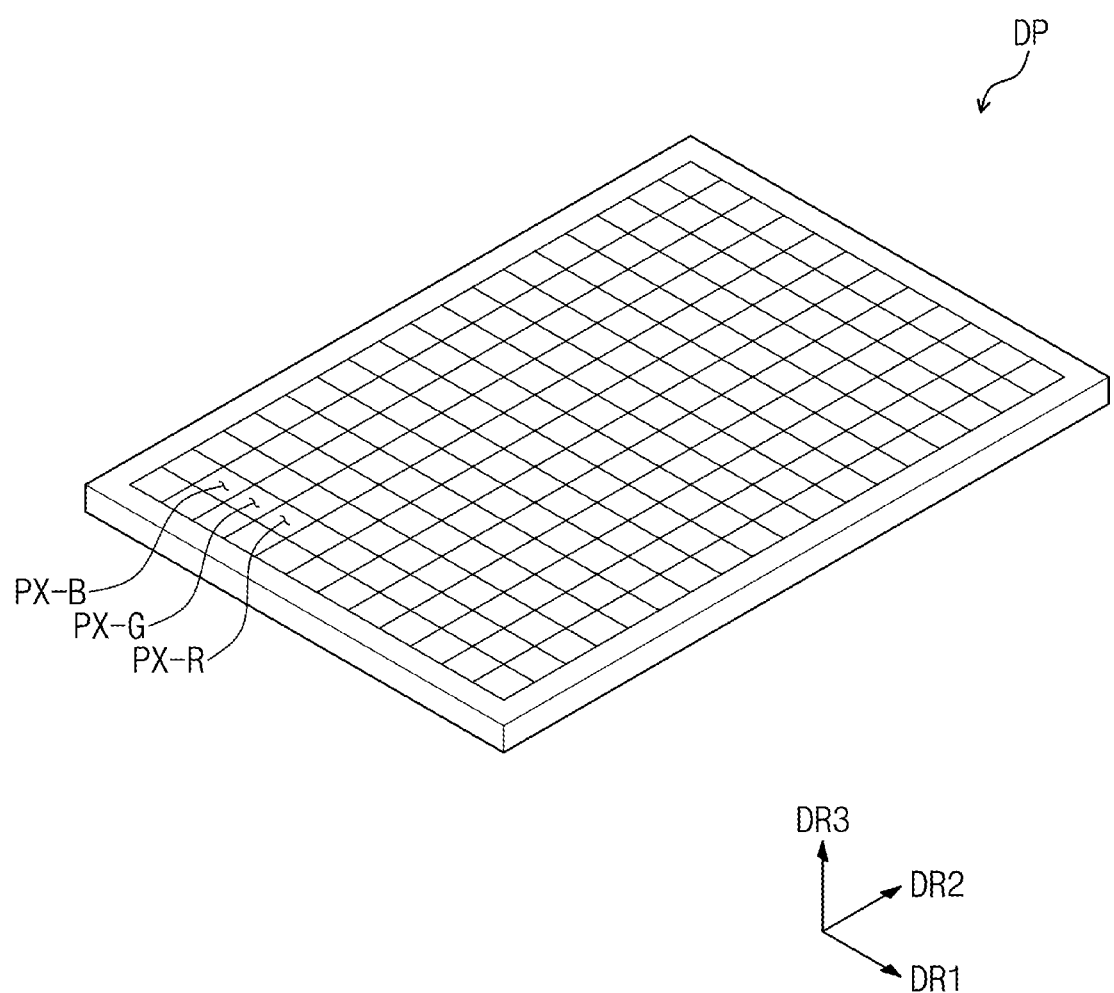
FIG. 2 is a perspective view schematically showing a display panel included in an organic electroluminescence display device according to an embodiment of the present disclosure.

FIG. 2 is a perspective view of the organic electroluminescence display panel DP included the organic electroluminescence display device DD according to an embodiment of the present disclosure illustrated in FIG. 1. As illustrated in FIG. 2, the organic electroluminescence display panel DP includes a plurality of pixels PX-B, PX-G, and PX-R. In FIG. 2, the three kinds of pixels PX-B, PX-G, and PX-R were exemplarily illustrated, and the three kinds of pixels PX-B, PX-G, and PX-R may generate light of different colors. For example, the three kinds of pixels PX-B, PX-G, and PX-R may respectively emit blue light, green light, and red light, but are not limited thereto. The three kinds of pixels PX-B, PX-G, and PX-R according to an embodiment of the present disclosure may respectively emit cyan light, yellow light, and magenta light. Also, alternatively, the three kinds of pixels PX-B, PX-G, and PX-R may generate light of the same or substantially the same color. The three kinds of pixels PX-B, PX-G, and PX-R may emit light in a third direction DR3 of FIG. 2.

For example, the three kinds of pixels PX-B, PX-G, and PX—R may be arranged in a matrix form on a plane defined by an axis of a first direction DR1 and an axis of a second direction DR2. Also, each of the three kinds of pixels PX-B, PX-G, and PX-R may be arranged in rows in the second direction DR2, but the embodiment of the present disclosure is not limited thereto. The arrangement of a plurality of pixels may have various suitable modifications according to a method for implementing a display panel. In addition, each of the pixels PX-B, PX-G, and PX-R generating light of different colors may be defined as a sub-pixel and a combination of the sub-pixels may be defined as a pixel (PX of FIG. 3).

A pixel according to an embodiment of the present disclosure may be a portion corresponding to an organic electroluminescence device of an embodiment to be described below. Also, the three pixels PX-B, PX-G, and PX-R may correspond to an organic electroluminescence device having light emitting layers emitting light of different wavelength regions.

Figure 3:
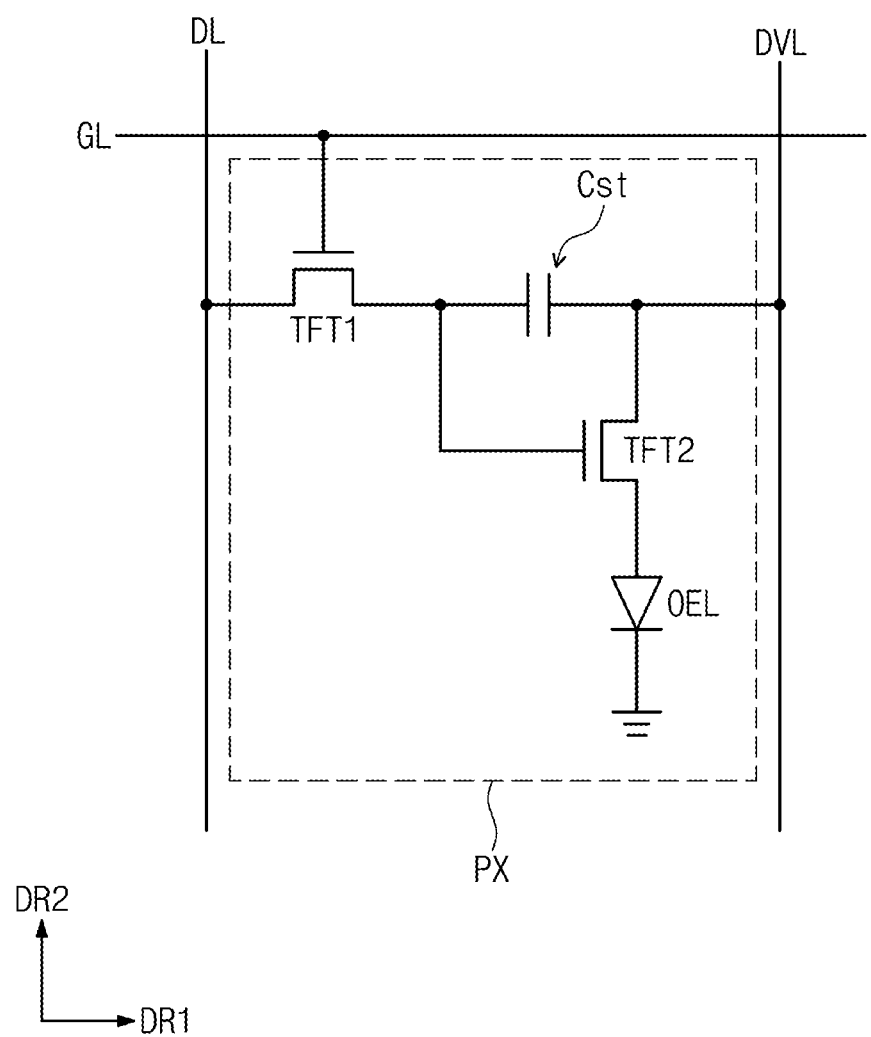
FIG. 3 is a circuit diagram of one of the pixels included in an organic electroluminescence display device according to an embodiment of the present disclosure.
Figure 4:
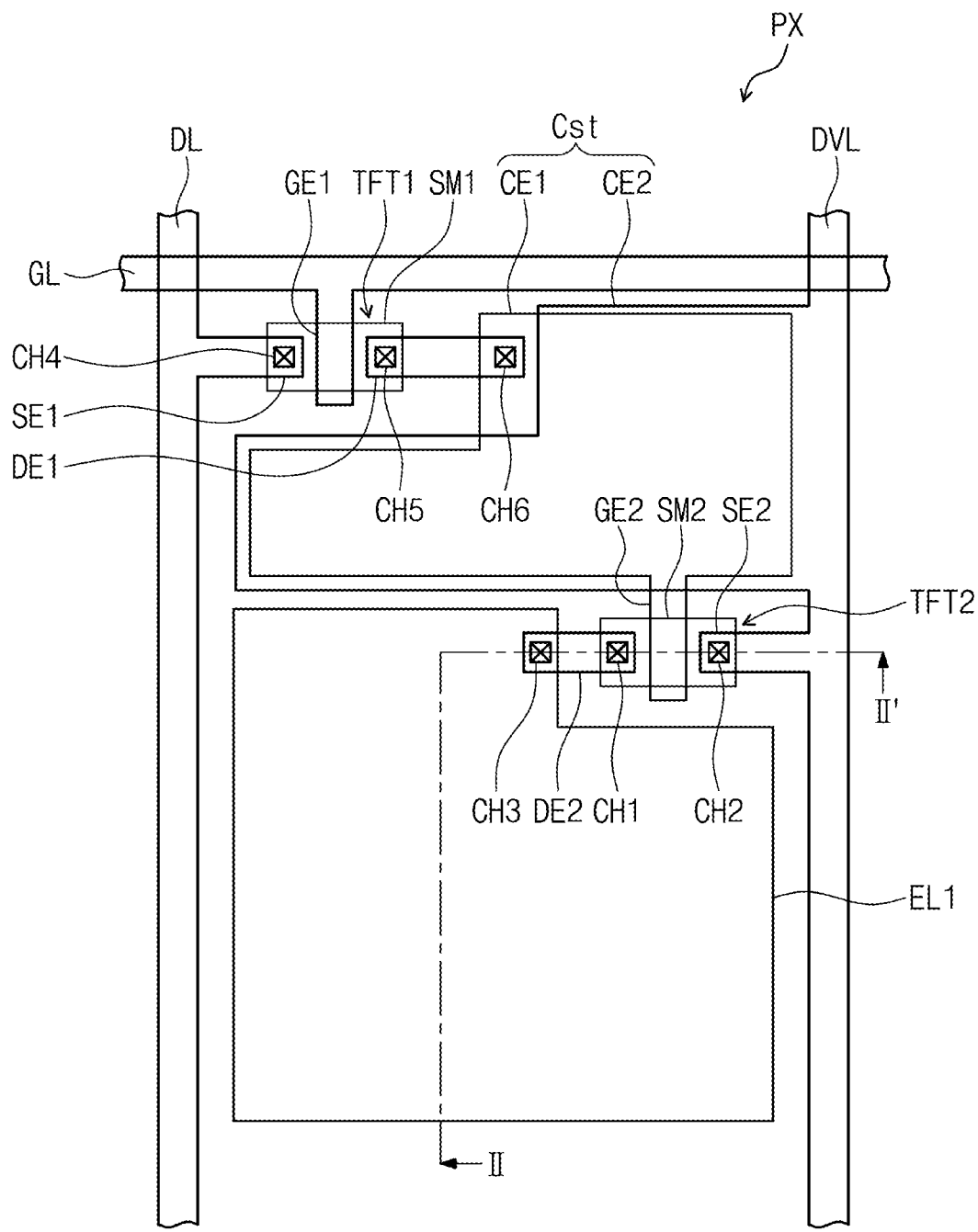
FIG. 4 is a plan view showing one of the pixels included in an organic electroluminescence display device according to an embodiment of the present disclosure.
Figure 5:
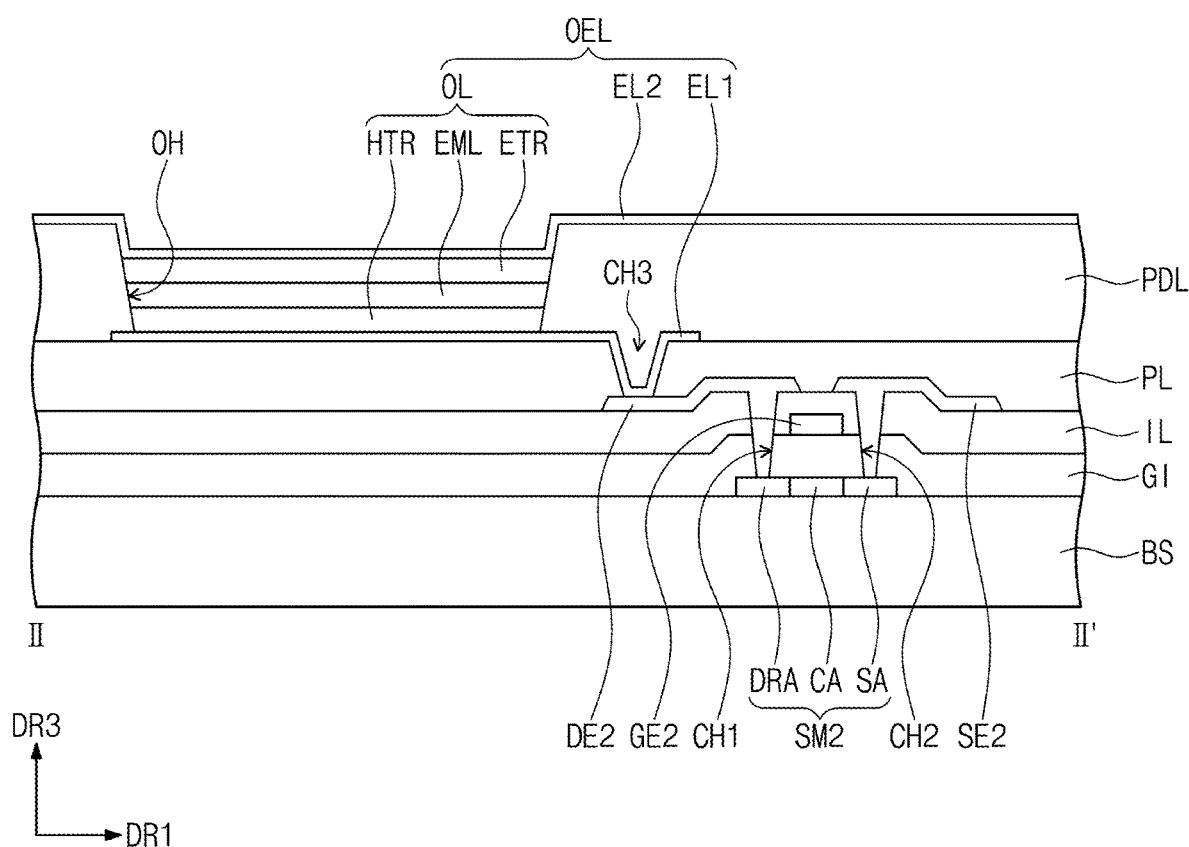
FIG. 5 is a cross-sectional view taken along line II-II' illustrated of FIG. 4.

FIG. 3 is a circuit diagram of one of the pixels included in an organic electroluminescence display device according to an embodiment of the present disclosure. FIG. 4 is a plan view showing one of the pixels included in an organic electroluminescence display device according to an embodiment of the present disclosure. FIG. 5 is a cross-sectional view taken along line II-II' illustrated in FIG. 4.

Referring to FIGS. 3 to 5, the pixel PX may be connected or coupled to a wiring portion composed of a gate line GL, a data line DL, and a driving voltage line DVL. The pixel PX may include thin film transistors TFT1 and TFT2 connected or coupled to the wiring portion, an organic electroluminescence device OEL connected or coupled to the thin film transistors TFT1 and TFT2, and a capacitor Cst. A detailed description of the organic electroluminescence device OEL will be described later.

The gate line GL is extended in the first direction DR1. The data line DL is extended in the second direction DR2 crossing the gate line GL. The driving voltage line DVL is extended in the substantially same direction as the data ling DL, that is, the second direction DR2. The gate line GL transmits a scanning signal to the thin film transistors TFT1 and TFT2. The data line DL transmits a data signal to the thin film transistors TFT1 and TFT2. The driving voltage line DVL provides a driving voltage to the thin film transistors TFT1 and TFT2.

The thin film transistors TFT1 and TFT2 may include a driving thin film transistor TFT2 for controlling the organic electroluminescence device OEL, and a switching thin film transistor TFT1 for switching the driving thin film transistor TFT2. In an embodiment of the present disclosure, the pixel PX including two thin film transistors TFT1 and TFT2 is described, but is not limited thereto. The pixel PX may include one thin film transistor and a capacitor, or the pixel PX may include three or more thin film transistors and two or more capacitors.

The switching thin film transistor TFT1 includes a first gate electrode GE1, a first source electrode SE1, and a first drain electrode DE1. The first gate electrode GE1 is connected or coupled to the gate line GL, and the first source electrode SE1 is connected or coupled to the data line DL. The first drain electrode DE1 is connected or coupled to a first common electrode CE1 through a fifth contact hole CH5. The switching thin film transistor TFT1 delivers a data signal applied to the data line DL to the driving thin film transistor TFT2 according to a scanning signal applied to the gate line GL. The driving thin film transistor TFT2 includes a second gate electrode GE2, a second source electrode SE2, and a second drain electrode DE2. The second gate electrode GE2 is connected or coupled to the first common electrode CE1. The second source electrode SE2 is connected or coupled to the driving voltage line DVL. The second drain electrode DE2 is connected or coupled to a first electrode EL1 through a third contact hole CH3.

The capacitor Cst is connected or coupled between the second gate electrode GE2 of the driving thin film transistor TFT2 and the second source electrode SE2 of the driving thin film transistor TFT2, and charges and maintains a data signal inputted to the second gate electrode GE2 of the driving thin film transistor TFT2. The capacitor Cst may include the first common electrode CE1 connected or coupled to the first drain electrode DE1 through a sixth contact hole CH6, and a second common electrode CE2 connected or coupled to the driving voltage line DVL.

The organic electroluminescence display device (DD of FIG. 1) according to an embodiment of the present disclosure may include a base substrate BS having the thin film transistors TFT1 and TFT2 and the organic electroluminescence device OEL laminated thereon. The base substrate BS is not particularly limited to a particular material as long as the material is available in the art, but may be formed, for example, of an insulating material, such as glass, plastic, and quartz. An organic polymer forming the base substrate BS may include polyethylene terephthalate (PET), polyethylene naphthalate (PEN), polyimide, polyether sulfone, and the like. The base substrate BS may be selected in consideration of the mechanical strength, thermal stability, transparency, surface smoothness, ease of handling, water resistance, and the like thereof.

On the base substrate BS, a substrate buffer layer may be disposed. The substrate buffer layer prevents impurities from diffusing into the switching thin film transistor TFT1 and the driving thin film transistor TFT2 (or reduces a likelihood or amount of such diffusion). The substrate buffer layer may be formed of silicon nitride (SiNx), silicon oxide (SiOx), silicon oxynitride (SiOxNy), and the like, and may be omitted according to the material and processing conditions of the base substrate BS.

On the base substrate BS, a first semiconductor layer SM1 and a second semiconductor layer SM2 are disposed. The first semiconductor layer SM1 and the second semiconductor layer SM2 are formed of a semiconductor material, and respectively act as an active layer for the switching thin film transistor TFT1 and the driving thin film transistor TFT2. The first semiconductor layer SM1 and the second semiconductor layer SM2 respectively include a source area SA, a drain area DRA, and a channel area CA disposed between the source area SA and the drain area DRA. The first semiconductor layer SM1 and the second semiconductor layer SM2 may be respectively selected from and formed of an inorganic semiconductor, or an organic semiconductor. The source area SA and the drain area DRA may be doped with an n-type impurity, or a p-type impurity.

On the first semiconductor layer SM1 and the second semiconductor layer SM2, a gate insulating layer GI is disposed. The gate insulating layer GI covers the first semiconductor layer SM1 and the second semiconductor layer SM1. The gate insulating layer GI may be formed of an organic insulating material or an inorganic insulating material.

On the gate insulating layer GI, the first gate electrode GE1 and the second gate electrode GE2 are disposed. The first gate electrode GE1 and the second gate electrode GE2 are provided to cover areas each corresponding to the channel area CA of the first semiconductor layer SM1 and the channel area CA of the second semiconductor layer SM2.

On the first gate electrode GE1 and the second gate electrode GE2, an interlayer insulating layer IL is disposed. The interlayer insulating layer IL covers the first gate electrode GE1 and the second gate electrode GE2. The interlayer insulating layer IL may be formed of an organic insulating material or an inorganic insulating material.

On the interlayer insulating layer IL, the first source electrode SE1, the first drain electrode DE1, the second source electrode SE2, and the second drain electrode DE2 are disposed. The second drain electrode DE2 comes into contact with the drain area DRA of the second semiconductor layer SM2 through a first contact hole CH1 disposed in the gate insulating layer GI and the interlayer insulating layer IL. The second source electrode SE2 comes into contact with the source area SA of the second semiconductor SM2 through a second contact hole CH2 disposed in the gate insulating layer GI and an interlayer insulating layer IL. The first source electrode SE1 comes into contact with a source area of the first semiconductor layer SM1 Through a fourth contact hole CH4 disposed in the gate insulating layer GI and the interlayer insulating layer IL. The first drain electrode DE1 comes into contact with a drain area of the first semiconductor layer SM1 through the fifth contact hole CH5 disposed in the gate layer GI and the interlayer insulating layer IL.

On the first source electrode SE1, the first drain electrode DE1, the second source electrode SE2, and the second drain electrode DE2, a passivation layer PL is disposed. The passivation layer PL may serve as a protection layer for protecting the switching thin film transistor TFT1 and the driving thin film transistor TFT2, or as a planarization layer for planarizing the upper surfaces thereof.

On the passivation layer PL, the organic electroluminescence device OEL is disposed. The organic electroluminescence device OEL includes the first electrode EL1, a second electrode EL2 disposed on the first electrode EL1, and an organic layer OL disposed between the first electrode EL1 and the second electrode EL2 and including a light emitting layer EML.

For example, on the passivation layer PL, the first electrode EL1 is provided, and on the passivation layer PL and the first electrode EL1, a pixel defining layer PDL is disposed. On the pixel defining layer PDL, an opening OH for exposing at least a part of the upper surface of the first electrode EL1 is defined. The pixel defining layer PDL may be configured to partition the organic electroluminescence device OEL so as to correspond to each of the pixels PX.

The pixel defining layer PDL includes a base resin and a hindered amine light stabilizer HALS. The "base resin" may mean a polymer resin to be the main component of the pixel defining layer PDL, but is not limited thereto. The base resin may include at least one of a polyimide-based resin, a polyamide-based resin, a polyacrylic resin, or a siloxane-based resin.

The base resin, which is the main component of the pixel defining layer PDL, may have the chemical bonding thereof be broken by UV rays and some visible rays entering from the outside, and a radical generated thereby is one of the main causes of the deterioration of an organic electroluminescence device. An embodiment of the present disclosure includes a radical scavenger in the pixel defining layer PDL to remove or capture a radical generated by external light. For example, in an embodiment of the present disclosure, the pixel defining layer PDL includes a hindered amine light stabilizer. When external light enters the hindered amine light stabilizer, the chemical bonding thereof is broken to form a radical. The radical formed thereby is combined with a base resin radical (hereinafter, "base resin radical") generated by having the chemical bonding broken by external light to generate a non-radical product. In other words, the hindered amine light stabilizer in the pixel defining layer PDL serves as a radical scavenger, and as a result, it is possible to minimize, prevent, or reduce the deterioration of a display device due to external light.

The hindered amine light stabilizer may be included in an amount of 0.01 wt % to 5.0 wt % based on the total 100 wt % of the base resin. For example, the hindered amine light stabilizer may be included in an amount of 1.0 wt % to 3.0 wt % based on the total 100 wt % of the base resin. When the hindered amine light stabilizer is included in an amount of less than 0.01 wt %, since the amount is insufficient for capturing or removing a base resin radical, the effect of preventing the pixel defining layer PDL from being damaged by external light is not sufficient. When the hindered amine light stabilizer is included in an amount of greater than 5.0 wt %, there is an increasing possibility that a side reaction may occur in which the hindered amine light stabilizer does not reacting with a base resin radial, but rather reacts with each other.

The hindered amine light stabilizer may include at least one of a first compound having a structure represented by formula 1 below in a molecule and a second compound having a structure represented by formula 2 below in a molecule.

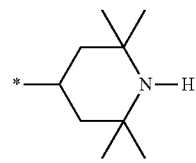

Formula 1

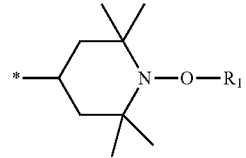

Formula 2

In the present disclosure, -* means a portion to be connected or coupled. For example, -* may be a portion that is connected or coupled to another substituent, or may be substituted with a hydrogen atom.

In Formula 2, $R_1$ is a hydrogen atom, a substituted or unsubstituted alkyl group having 1 to 10 carbon atoms, or a substituted or unsubstituted aryl group having 6 to 20 ring-forming carbon atoms.

In the present disclosure, "substituted or unsubstituted" may mean substituted or unsubstituted with one or more substituents selected from the group consisting of a deuterium atom, a halogen atom, a cyano group, a nitro group, an amino group, an alkyl group, an alkenyl group, a hydrocarbon ring group, a heterocyclic group, and a combination thereof.

In the present disclosure, the alkyl group can be linear, branched or cyclic. The number of carbon atoms in the alkyl group is 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, a cyclobutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, a n-decyl group, an adamantyl group, a 2-ethyldecyl group, a butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyl icocyl group, a 2-butyl eicosyl group, a 2-hexyl eicosyl group, a 2-octyl eicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, and the like, but are not limited thereto.

In the present disclosure, the aryl group means any functional group or substituent derived from an aromatic hydrocarbon ring. The aryl group may be a monocyclic aryl group or a polycyclic aryl group. The number of ring-forming carbon atoms of the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quarterphenyl group, a quinquephenyl group, a sexiphenyl group, a biphenylene group, a triphenylene group, a pyrenyl group, a benzofluoranthenyl group, a chrysenyl group, and the like, but are not limited thereto.

The pixel defining layer PDL may include both the first compound and the second compound, but is not limited thereto. The pixel defining layer PDL may include the first compound or the second compound.

The first compound and the second compound may each be decomposed by external light into a first radical represented by formula A below.

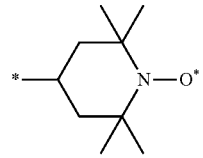

Formula A

The first radical may be combined with a base resin radical generated by external light to generate a non-radical compound represented by formula B below.

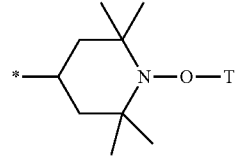

Formula B

In Formula B, T is a base resin radical.

Meanwhile, oxygen out gas may be generated in the pixel defining layer PDL due to external light, and a reaction in which oxygen and a base resin radical reacts with each other to form a new oxygen radical may also occur. The oxygen radical may react with the non-radical compound represented by Formula B to provide an unstable intermediate represented by formula C below.

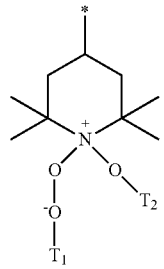

Formula C

In Formula C, $T_1$ and $T_2$ are respectively base resin radicals.

The intermediate represented by Formula C is very unstable and decomposes rapidly. The first radical represented by Formula A and the non-radical product may be finally generated and decomposed. The final non-radical product may include a first product including a hydroxy group and a second product including a carbonyl group.

Although not limited thereto, at least one of the first product and the second product may be further included in the pixel defining layer PDL.

The first compound represented by Formula 1 may be represented, for example, by formula 1-1 below.

Formula 1-1

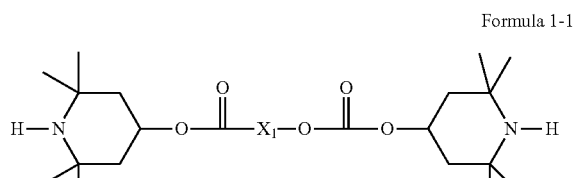

In Formula 1-1, $X_1$ is a unit including any one selected from structural formulas below or a combination of thereof.

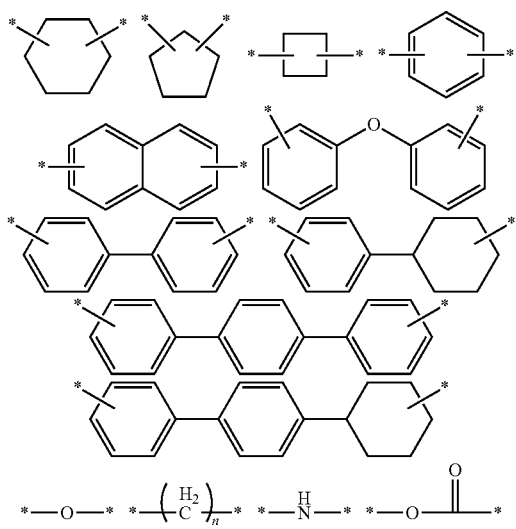

In the structural formula, n is an integer from 1 to 10.

The second compound represented by Formula 2 may be represented, for example, by formula 2-1 below.

[Formula 2-1]

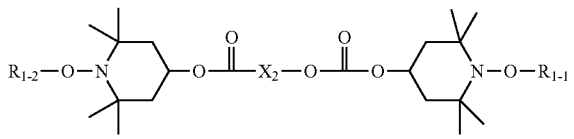

In Formula 2-1, $R_{1-1}$ and $R_{1-2}$ are each independently a hydrogen atom, a substituted or unsubstituted alkyl group having 1 to 10 carbon atoms, or a substituted or unsubstituted aryl group having 6 to 20 ring-forming carbon atoms, and $X_2$ is a unit including any one of the following structural formulas or a combination thereof.

In the structural formula, n is an integer from 1 to 10.

The base resin may include a polyamide-based resin, for example, a polyamide-based resin represented by formula 3 below.

Formula 3

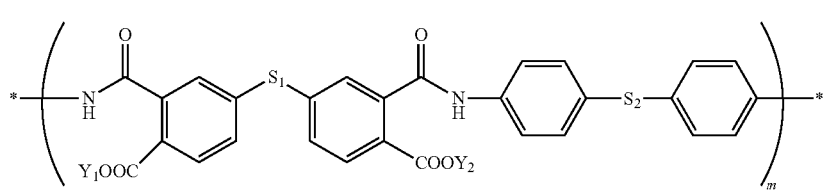

In Formula 3, m is an integer from 1 to 1000, $Y_1$ and $Y_2$ are each independently a hydrogen atom, a substituted or unsubstituted alkyl group having 1 to 10 carbon atoms, or a substituted or unsubstituted aryl group having 6 to 20 ring-forming carbon atoms, and $S_1$ and $S_2$ are each independently a unit including any one of the following structural formulas or a combination thereof.

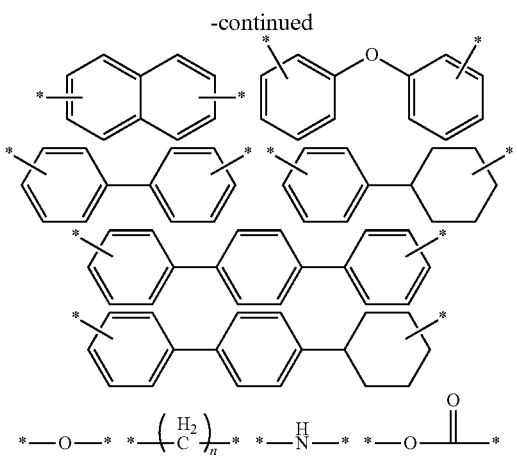

In the structural formula, n is an integer from 1 to 10.

The base resin may include a siloxane-based resin, for example, a siloxane-based resin represented by formula 4 below.

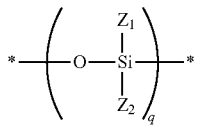

Formula 4

In Formula 4, q is an integer from 1 to 1000, $Z_1$ and $Z_2$ are each independently a unit including any one of the following structural formulas or a combination thereof.

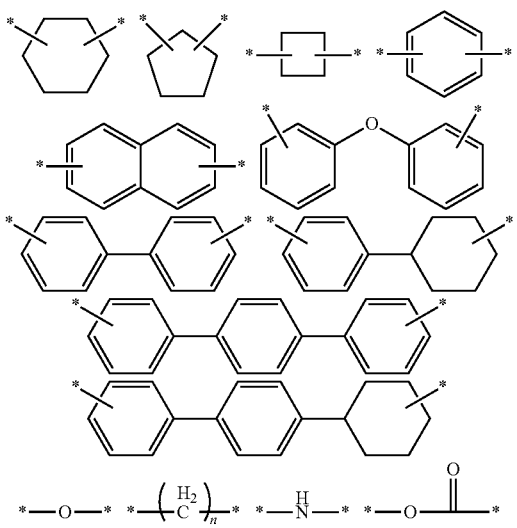

In the structural formula, n is an integer from 1 to 10.

The pixel defining layer PDL may further include an additional additive as needed. Any suitable additive available in the art may be employed without limitation. For example, the pixel defining layer PDL may further include an ultraviolet ray absorbing agent. When the pixel defining layer PDL includes both the hindered amine light stabilizer and the ultraviolet ray absorbing agent, the effect of preventing the pixel defining layer PDL from being damaged by external light may be enhanced (or the effect of reducing a likelihood or amount of such damage may be enhanced). For example, the ultraviolet ray absorbing agent may include at least one of a benzotriazole-based ultraviolet ray absorbing agent, a benzophenone-based ultraviolet ray absorbing agent, a salicylic acid-based ultraviolet ray absorbing agent, a salicylate-based ultraviolet ray absorbing agent, a cyanoacrylate-based ultraviolet ray absorbing agent, a cinnamate-based ultraviolet ray absorbing agent, an oxanilide-based ultraviolet ray absorbing agent, a polystyrene-based ultraviolet ray absorbing agent, a polyphenoxysilane-based ultraviolet ray absorbing agent, a methine-based ultraviolet ray absorbing agent, an azomethine-based ultraviolet ray absorbing agent, a triazine-based ultraviolet ray absorbing agent, a para-aminobenzoic acid-based ultraviolet ray absorbing agent, a cinnamic acid-based ultraviolet ray absorbing agent, and a urocanic acid-based ultraviolet ray absorbing agent.

When the pixel defining layer PDL further includes an additional additive besides the hindered amine light stabilizer, the hindered amine light stabilizer and the additional additive may be included in an amount of 1 wt % to 10 wt % based on 100 wt % of the total basin resin.

On the pixel defining layer PDL and the first electrode EL1, the organic layer OL and the second electrode EL2 are sequentially laminated.

The first electrode EL1 may be, for example, a positive electrode. The first electrode EL1 comes into contact with the second drain electrode DE2 of the driving thin film transistor TFT2 through the third contact hole CH3 provided on the passivation layer PL. The first electrode EL1 may be a reflective electrode, but the present embodiment is not limited thereto. For example, the first electrode EL1 may be a transmissive electrode or a transflective electrode. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound, or a mixture thereof (for example, a mixture of Ag and Mg). Or, the first electrode EL1 may have a multilayer structure including a reflective film or a transflective film, both formed of the above-mentioned materials, and a transparent conductive film formed of indium tin oxide (ITO), indium zinc oxide (IZO), zinc oxide (ZnO), indium tin zinc oxide (ITZO), and the like.

On the first electrode EL1, the organic layer OL is disposed. The organic layer OL is disposed on the first electrode EL1 exposed by the opening OH. The organic layer OL may include a hole transport region HTP disposed on the first electrode EL1, the light emitting layer EML disposed on the hole transport region HTR, and an electron transporting region ETR disposed on the light emitting layer EML.

The hole transport region HTR may have a single layer structure having a single layer formed of a single material, a single layer structure having a single layer formed of a plurality of different materials, or a multilayer structure having a plurality of layers formed of a plurality of different materials. For example, the hole transport region HTR may have a single layer structure having a single layer formed of a plurality of different materials, or have a structure of a hole injection layer/a hole transport layer, a hole injection layer/a hole transport layer/a buffer layer, a hole injection layer/a buffer layer, a hole transport layer/a buffer layer, or a hole injection layer/a hole transport layer/an electron blocking layer, sequentially laminated from the first electrode EL1, but is not limited thereto.

For example, the hole transport region HTR may include a hole injection layer and a hole transport layer, and in the hole injection layer and the hole transport layer, any suitable hole injection material available in the art and any suitable hole transport material available, respectively, may be used.

The light emitting layer EML is provided on the hole transport region HTR. The light emitting layer EML may have a single layer structure having a single layer formed of a single material, a single layer structure having a single layer formed of a plurality of different materials, or a multilayer structure having a plurality of layers formed of a plurality of different materials.

The light emitting layer EML is not particularly limited to a particular material as long as the material is available in the art, but may be formed, for example, of a material for emitting red, green, and blue colors, and may include a fluorescent material or a phosphorescent material. Also, the light emitting layer EML may include a host or a dopant.

The electron transporting region ETR is provided on the light emitting layer EML. The electron transporting region ETR may include at least one of a hole blocking layer, an electron transport layer, or an electron injection layer, but is not limited thereto.

When the electron transporting region ETR includes an electron injection layer and an electron transport layer, in the electron injection layer and the electron transport layer, any suitable electron injection material available in the art and any suitable electron transport material available in the art, respectively, may be used.

The second electrode EL2 is provided on the electron transport region ETR. The second electrode EL2 may be a common electrode or a cathode. The second electrode EL2 may be formed of a metal alloy or a conductive compound. The second electrode may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound, or a mixture thereof (for example, a mixture of Ag and Mg). Or, the second electrode EL2 may be of a structure of a plurality of layers including a reflective film or a transflective film, both formed of the above-mentioned materials, and a transparent conductive film formed of indium tin oxide (ITO), indium zinc oxide (IZO), zinc oxide (ZnO), indium tin zinc oxide (ITZO), and the like.

The second electrode EL2 may be connected or coupled to an auxiliary electrode. When the second electrode EL2 is connected or coupled to the auxiliary electrode, the resistance of the second electrode EL2 may be reduced.

Figure 6:
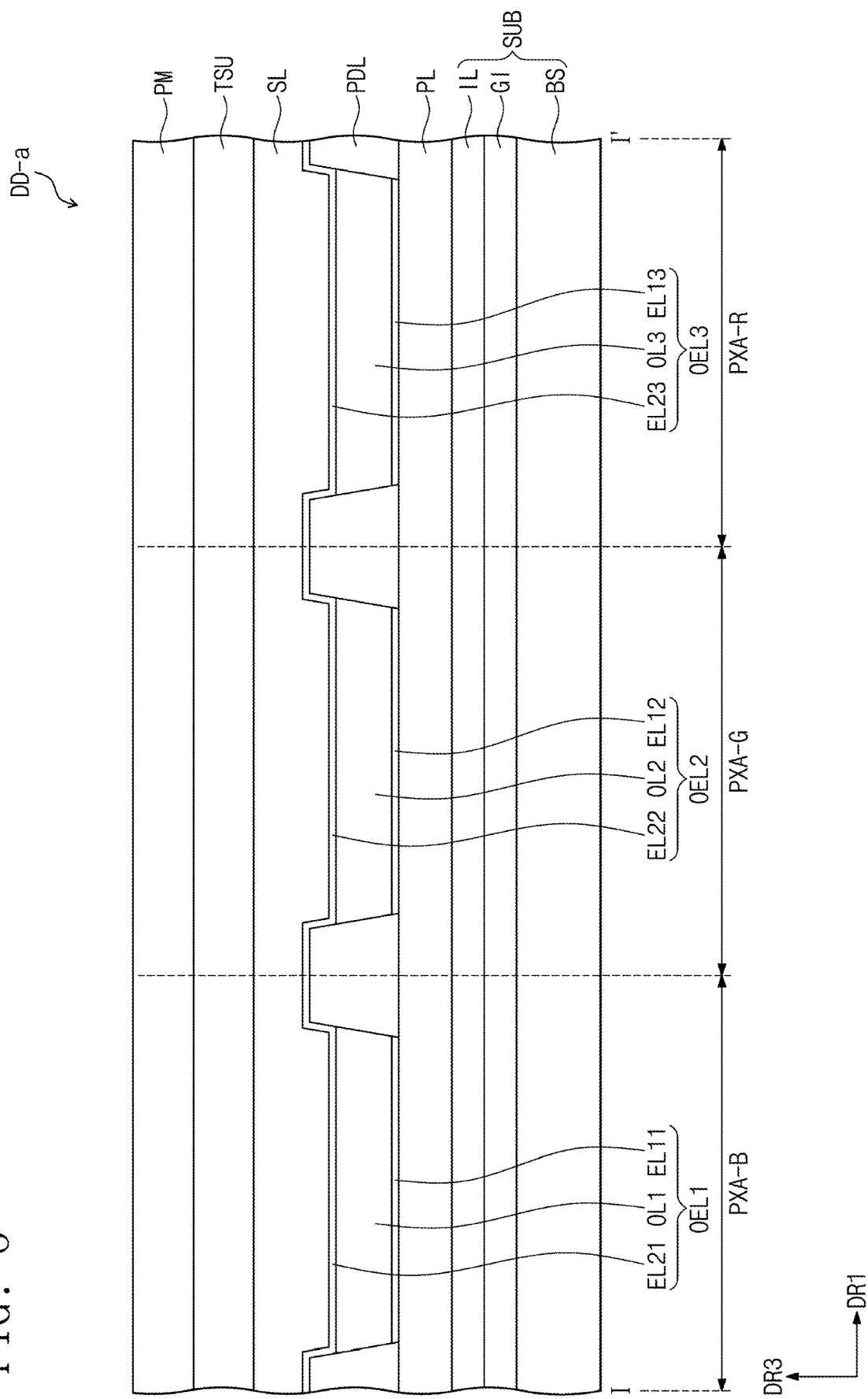
FIG. 6 is a cross-sectional view taken along line I-I' of FIG. 1.

FIG. 6 is a cross-sectional view taken along line I-I' illustrated in FIG. 1.

Referring to FIG. 6, an organic electroluminescence display device DD-a according to an embodiment of the present disclosure may further include a sealing layer SL. The sealing layer SL is disposed on second electrodes EL21, EL22, and EL23. The sealing layer SL may be one layer or a plurality of layers laminated. The sealing layer SL may include at least one layer of an organic layer and an inorganic layer. The sealing layer SL may be formed including at least one organic layer and at least one inorganic layer.

On one side of the sealing layer SL, a black printing layer may be partially disposed. For example, the black printing layer may be disposed on one side of the sealing layer SL adjacent to the second electrode EL2. The black printing layer may be correspondingly disposed on the pixel defining layer PDL, but the present embodiment is not limited thereto. Meanwhile, the sealing layer SL may be omitted, and a separate sealing member may be added on the organic electroluminescence device (OEL of FIG. 5).

The organic electroluminescence display device DD-a may include a plurality of pixel regions PXA-B, PXA-G, and PXA-R. For example, the organic electroluminescence display device DD-a may include a first pixel region PXA-B, a second pixel region PXA-G, and a third pixel region PXA-R, all of which emit light of different wavelengths. In the embodiment illustrated in FIG. 6, the first pixel region PXA-B may be a blue pixel region, the second pixel region PXA-G may be a green pixel region, and the third pixel region PXA-R may be a red pixel region. In an embodiment, the organic electroluminescence display device DD-a may include a blue pixel region, a green pixel region, and a red pixel region. For example, a blue pixel region is a blue light emitting region for emitting blue light, a green pixel region and a red pixel region respectively represent a green light emitting region and a red light emitting region. Meanwhile, the pixel regions PXA-B, PXA-G, and PXA-R may be light emitting regions each corresponding to the plurality of pixels PX-B, PX-G, and PX-R in the description of FIG. 2.

The first pixel region PXA-B may be a region in which a first organic electroluminescence device OEL1 having a first organic layer OL1 is disposed. Also, the second pixel region PXA-G and the third pixel region PXA-R may respectively be regions in which a second organic electroluminescence device OEL2 and a third organic electroluminescence device OEL3 are disposed.

For example, the first organic electroluminescence device OEL1 may include a first electrode EL11, the first organic layer OL1, and a second electrode EL21. The first organic layer OL1 may include a hole transport region, a light emitting layer, and an electron transporting region. For example, the first organic electroluminescence device OEL1 may include a light emitting layer for emitting blue light. The second organic electroluminescence device OEL2 may include a first electrode EL12, a second organic layer OL2, and a second electrode EL22. The third organic electroluminescence device OEL3 may include a first electrode EL13, a third organic layer OL3, and a second electrode EL23. The second organic electroluminescence device OEL2 and the third organic electroluminescence device OEL3 may respectively include light emitting layers for emitting green light and red light.

In an embodiment, each of the first to third organic electroluminescence devices OEL1, OEL2, and OEL3 may emit light of a set or specific color, for example, one of blue light, green light, and red light. However, the type or kind of color light is not limited to the above-mentioned types or kinds, and for example, cyan light, magenta light, yellow light, and the like may be added thereto.

Also, in an embodiment, the first to third organic electroluminescence devices OEL1, OEL2, and OEL3 may emit light of the same or substantially the same color. In an embodiment, each of the first to third organic electroluminescence devices OEL1, OEL2, and OEL3 may include a plurality of light emitting layers laminated in a third direction DR3, which is a thickness direction. In this case, the plurality of light emitting layers may respectively emit light of different wavelength regions, or two or more light emitting layers may emit light of different wavelength regions, or may emit light of the same or substantially the same wavelength region.

The organic electroluminescence display device DD-a of the embodiment of the present disclosure illustrated in FIG. 6 may include a polarizing member PM disposed on the organic electroluminescence display panel DP. The polarizing member PM may correspond to the optical member OM in the organic electroluminescence display device DD of the embodiment illustrated in FIG. 1.

The polarizing member PM may be disposed on the organic electroluminescence devices OEL1, OEL2, and OEL3 of the organic electroluminescence display panel DP. The polarizing member PM may function to block reflected light when light provided from the outside of the organic electroluminescence display device DD-a is incident to the organic electroluminescence display panel DP and then emitted again. Any suitable polarizing member PM that is available in the art may be employed without limitation. For example, the polarizing member PM may include an ultraviolet ray absorbing agent to minimize or reduce the amount of ultraviolet rays entering the pixel defining layer PDL such that the effect of preventing the pixel defining layer PDL from being damaged by external light may be enhanced (or the effect of reducing a likelihood or amount of such damage may be enhanced).

The organic electroluminescence display device DD-a according to an embodiment of the present disclosure may further include an input sensing unit TSU. The input sensing unit TSU may be disposed between the organic electroluminescence display panel DP and the polarizing member PM. The input sensing unit TSU may be directly disposed on the sealing layer SL of the organic electroluminescence display panel DP. For example, the input sensing unit TSU may be directly disposed on the organic electroluminescence display panel DP without having a separate adhesive member, but is not limited thereto. An adhesive member may be disposed between the input sensing unit TSU and the organic electroluminescence display panel DP.

In addition, the arrangement order of the input sensing unit TSU and the polarizing member PM is not limited to FIG. 6. For example, the polarizing member PM may be disposed between the organic electroluminescence display panel DP and the input sensing unit TSU. The organic electroluminescence display device DD-a according to an embodiment of the present disclosure may further include a substrate SUB including an interlayer insulating layer IL, a gate insulating layer GI, and a base substrate BS.

Figure 7:
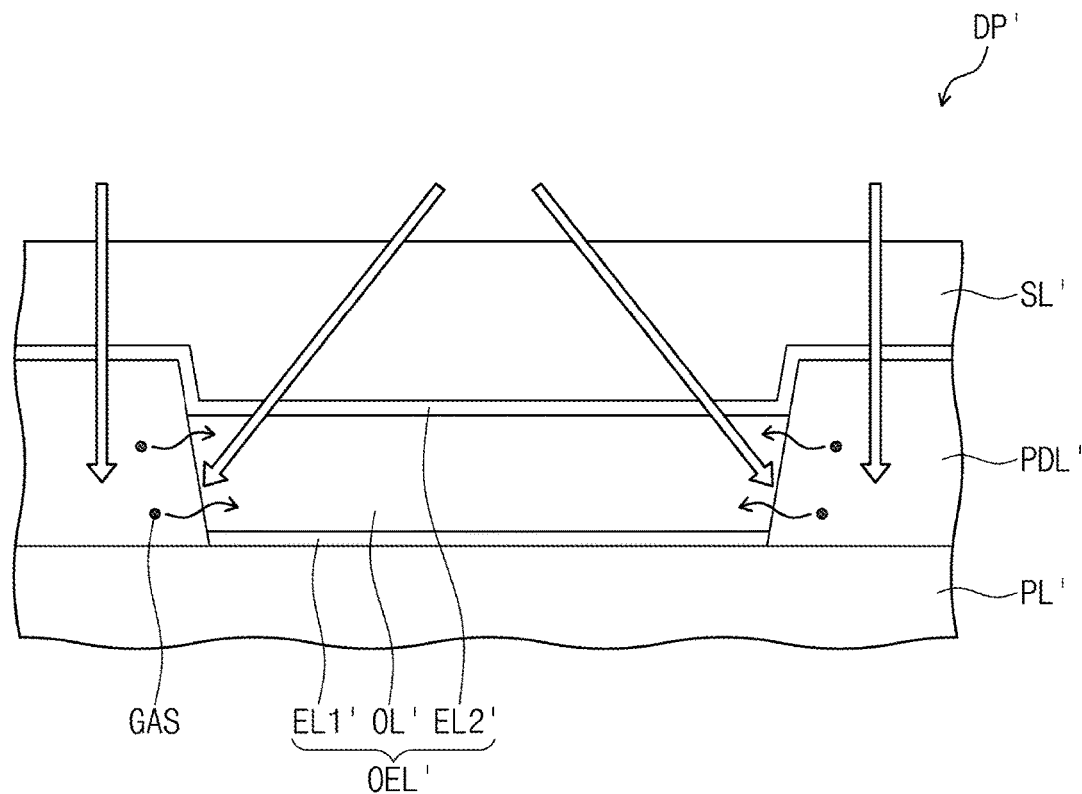
FIG. 7 is a cross-sectional view showing a part of an organic electroluminescence display device.
Figure 8:
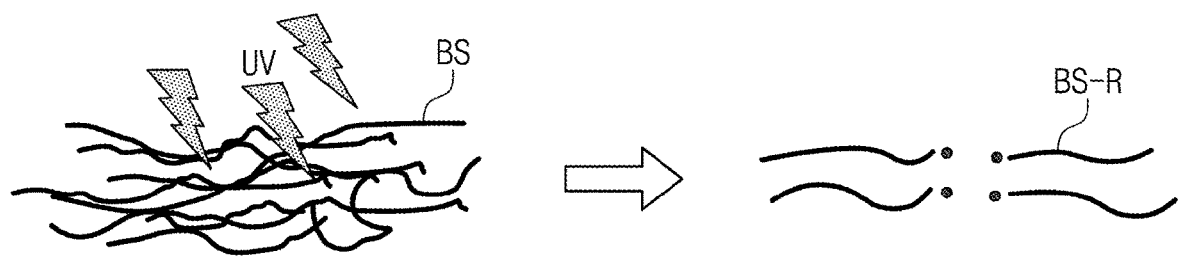
FIG. 8 is a view showing a change in a pixel defining layer due to external light in an organic electroluminescence display device.

FIG. 7 is a view showing a part of an organic electroluminescence display device. FIG. 8 is a view showing a change in a pixel defining layer due to external light in the organic electroluminescence display device Referring to FIGS. 7 and 8, an organic electroluminescence display panel DP' not including a hindered amine light stabilizer in a pixel defining layer PDL' has external light transmitted a sealing layer SL' and an organic electroluminescence device OEL' and entering the pixel defining layer PDL' to cause the deterioration, denaturation, photo-degradation, and the like of the pixel defining layer PDL'. As a result, gas (GAS) is released to damage an organic layer OL' or a first electrode EL1', thereby reducing the light emitting efficiency of the organic electroluminescence device OEL', or causing the pixel shrinkage thereof. The display panel DP' also includes a second electrode EL2'. Referring to FIG. 8, a base resin BS is photo-degraded by external light UV to provide a base resin radical BS-R, and the base resin radical BS-R becomes the main cause of gas release.

As described above, an embodiment of the present disclosure includes a hindered amine light stabilizer capable of removing or capturing a base resin radial in a pixel defining layer, thereby preventing, minimizing, or reducing limitations such as lowering the reliability and deteriorating display quality of a display device due to external light. By including a hindered amine light stabilizer is included in a form of an additive instead of disposing a separate layer for blocking external light, a limitation of lowering the reliability of a display device due to external light may be simply solved.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The above-disclosed subject matter is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An organic electroluminescence display device comprising:
   a substrate;
   a first electrode disposed on the substrate;
   a pixel defining layer disposed on a portion of the first electrode and having an opening defined therein for exposing at least another portion of the first electrode, the opening of the pixel defining layer defining a pixel;
   an organic layer disposed on the first electrode exposed by the opening and comprising a light emitting layer, the organic layer being in the pixel defined by the opening of the pixel defining layer;
   a second electrode disposed on the organic layer; and
   a passivation layer disposed between the substrate and the first electrode;

wherein the pixel defining layer comprises a base resin and a hindered amine light stabilizer (HALS),
wherein the pixel defining layer is a partition wall, and
wherein the pixel defining layer which comprises the hindered amine light stabilizer (HALS) is disposed on the same layer as the organic layer comprising the emission layer.

2. The organic electroluminescence display device of claim 1, wherein the hindered amine light stabilizer is present in an amount of 0.01 wt % to 5.0 wt % based on the total 100 wt % of the base resin.

3. The organic electroluminescence display device of claim 1, wherein the hindered amine light stabilizer comprises at least one of a first compound having a structure represented by Formula 1 below in a molecule and a second compound having a structure represented by Formula 2 below in a molecule:

Formula 1

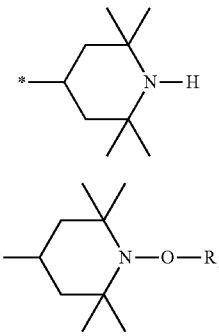

Formula 2 in Formula 2, $R_1$ is a hydrogen atom, a substituted or unsubstituted alkyl group having 1 to 10 carbon atoms, or a substituted or unsubstituted aryl group having 6 to 20 ring-forming carbon atoms.

4. The organic electroluminescence display device of claim 3, wherein Formula 1 is represented by Formula 1-1 below:

Formula 1-1

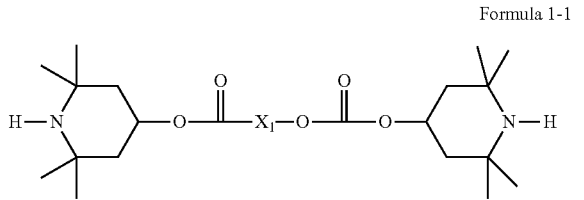

in Formula 1-1, $X_1$ is a unit comprising any one of the following structural formulas or a combination thereof:

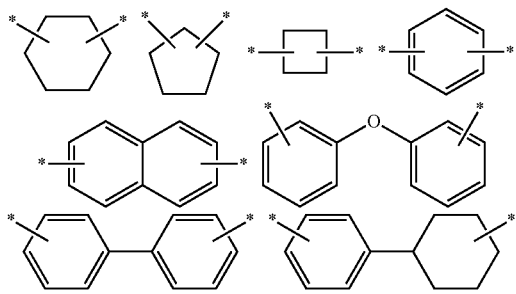

-continued

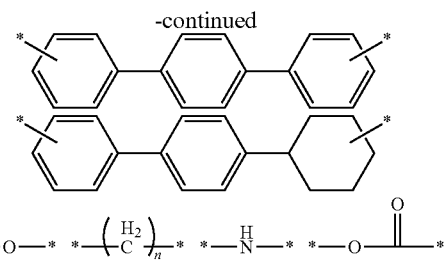

in the structural Formula above, n is an integer from 1 to 10.

5. The organic electroluminescence display device of claim 3, wherein Formula 2 is represented by Formula 2-1 below:

Formula 2-1

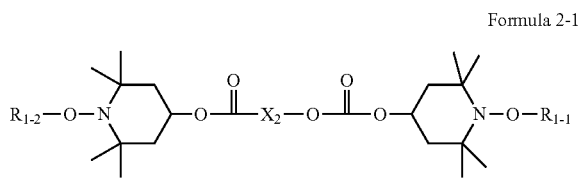

in Formula 2-1,
$R_{1-1}$ and $R_{1-2}$ are each independently a hydrogen atom, a substituted or unsubstituted alkyl group having 1 to 10 carbon atoms, or a substituted or unsubstituted aryl group having 6 to 20 ring-forming carbon atoms, and
$X_2$ is a unit comprising any one of the following structural formulas or a combination thereof:

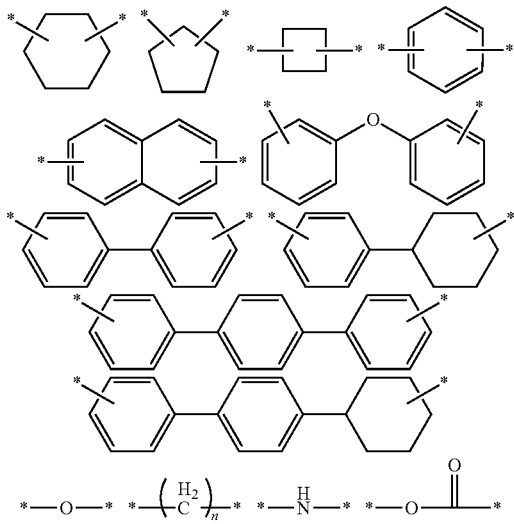

in the structural formula above, n is an integer from 1 to 10.

6. The organic electroluminescence display device of claim 3, wherein the hindered amine light stabilizer comprises both the first compound and the second compound.

7. The organic electroluminescence display device of claim 1, wherein the base resin comprises at least one of a polyimide-based resin, a polyamide-based resin, a polyacrylic resin, or a siloxane-based resin.

8. The organic electroluminescence display device of claim 1, wherein the base resin comprises a polyamide-based resin represented by Formula 3 below:

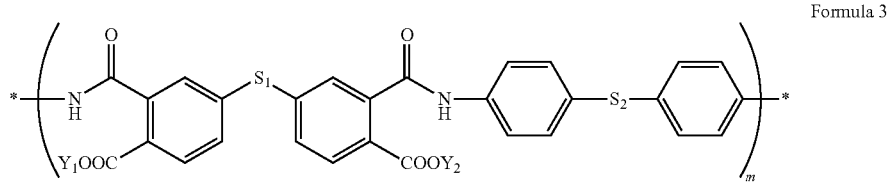
Formula 3 in Formula 3,
m is an integer from 1 to 1000,
$Y_1$ and $Y_2$ are each independently a hydrogen atom, a substituted or unsubstituted alkyl group having 1 to 10 carbon atoms, or a substituted or unsubstituted aryl group having 6 to 20 ring-forming carbon atoms, and
$S_1$ and $S_2$ are each independently a unit comprising any one of the following structural formulas or a combination thereof:

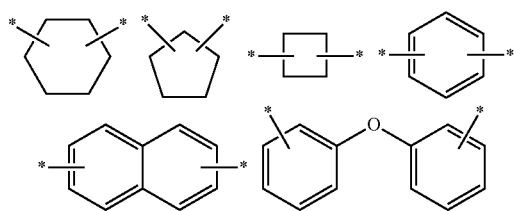

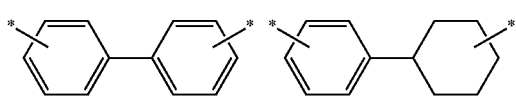

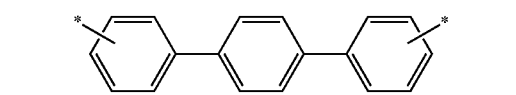

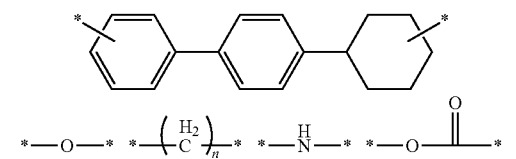

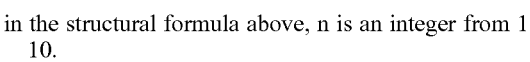

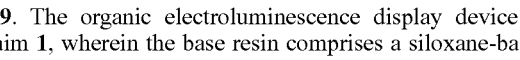

in the structural formula above, n is an integer from 1 to 10.

9. The organic electroluminescence display device of claim 1, wherein the base resin comprises a siloxane-based resin represented by Formula 4 below:

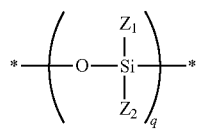
Formula 4 in Formula 4,
q is an integer from 1 to 1000,
$Z_1$ and $Z_2$ are each independently a unit comprising any one of the following structural formulas or a combination thereof:

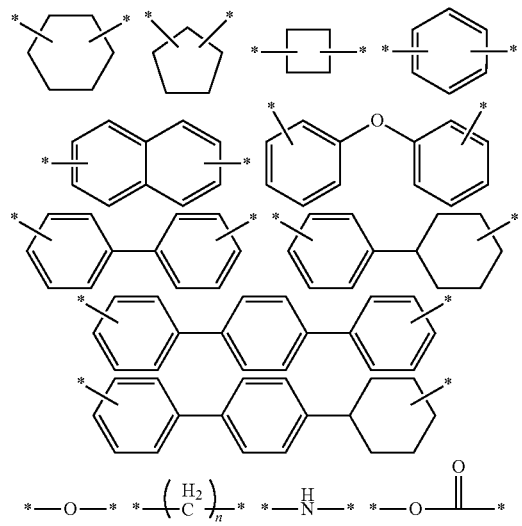

in the structural formula above, n is an integer from 1 to 10.

10. The organic electroluminescence display device of claim 1, wherein the pixel defining layer further comprises an ultraviolet ray absorbing agent.

* * * * *